(12) United States Patent
Iwami et al.

(10) Patent No.: US 7,068,988 B2
(45) Date of Patent: Jun. 27, 2006

(54) RADIO RECEPTION APPARATUS, SIGNAL PROCESSING TIMING CONTROL METHOD, AND SIGNAL PROCESSING TIMING CONTROL PROGRAM

(75) Inventors: Masashi Iwami, Daito (JP); Katsutoshi Kawai, Daito (JP)

(73) Assignees: Sanyo Electric Co., Ltd., Osaka (JP); Sanyo Telecommunications Co., Ltd., Osaka (JP)

( * ) Notice: Subject to any disclaimer, the term of this patent is extended or adjusted under 35 U.S.C. 154(b) by 206 days.

(21) Appl. No.: 10/496,105

(22) PCT Filed: Nov. 15, 2002

(86) PCT No.: PCT/JP02/11977

§ 371 (c)(1),
(2), (4) Date: May 19, 2004

(87) PCT Pub. No.: WO03/045027

PCT Pub. Date: May 30, 2003

(65) Prior Publication Data

US 2005/0020221 A1 Jan. 27, 2005

(30) Foreign Application Priority Data

Nov. 20, 2001 (JP) .............................. 2001-354271

(51) Int. Cl.
H04B 1/06 (2006.01)
H04B 7/00 (2006.01)

(52) U.S. Cl. ................................ 455/232.1; 455/234.2; 455/239.1; 455/240.1; 455/241.1; 375/261; 375/345

(58) Field of Classification Search ........... 455/232.01, 455/234.2, 239.1, 240.1, 241.1, 245.1, 250.1; 375/261, 345
See application file for complete search history.

(56) References Cited

U.S. PATENT DOCUMENTS

| 6,088,583 A | * | 7/2000 | Shimizu et al. | .......... 455/235.1 |
| 2001/0053680 A1 | * | 12/2001 | Yamanaka et al. | ........ 455/232.1 |
| 2003/0026363 A1 | * | 2/2003 | Stoter et al. | ................ 375/345 |

FOREIGN PATENT DOCUMENTS

| JP | 59-182660 A | 10/1984 |
| JP | 4-117837 A | 4/1992 |
| JP | 4-167629 A | 6/1992 |
| JP | 11-341091 A | 12/1999 |
| JP | 2000-286654 A | 10/2000 |

* cited by examiner

*Primary Examiner*—Duc Nguyen
*Assistant Examiner*—Tuan Pham
(74) *Attorney, Agent, or Firm*—Foley & Lardner LLP

(57) ABSTRACT

In a radio reception apparatus, a variable gain of a reception amplifier is adjusted by an AGC control unit for each frame of a received signal for execution of an AGC operation. The AGC control unit determines and indicates to a digital signal processing unit an AGC operation end point of time. The digital signal processing unit executes prescribed signal processing on a digital signal obtained after the end of the AGC operation, in a known signal segment. Therefore, reception errors caused by erroneous amplitude values of digital signals resulting from the AGC operation can be prevented.

24 Claims, 6 Drawing Sheets

F I G. 3
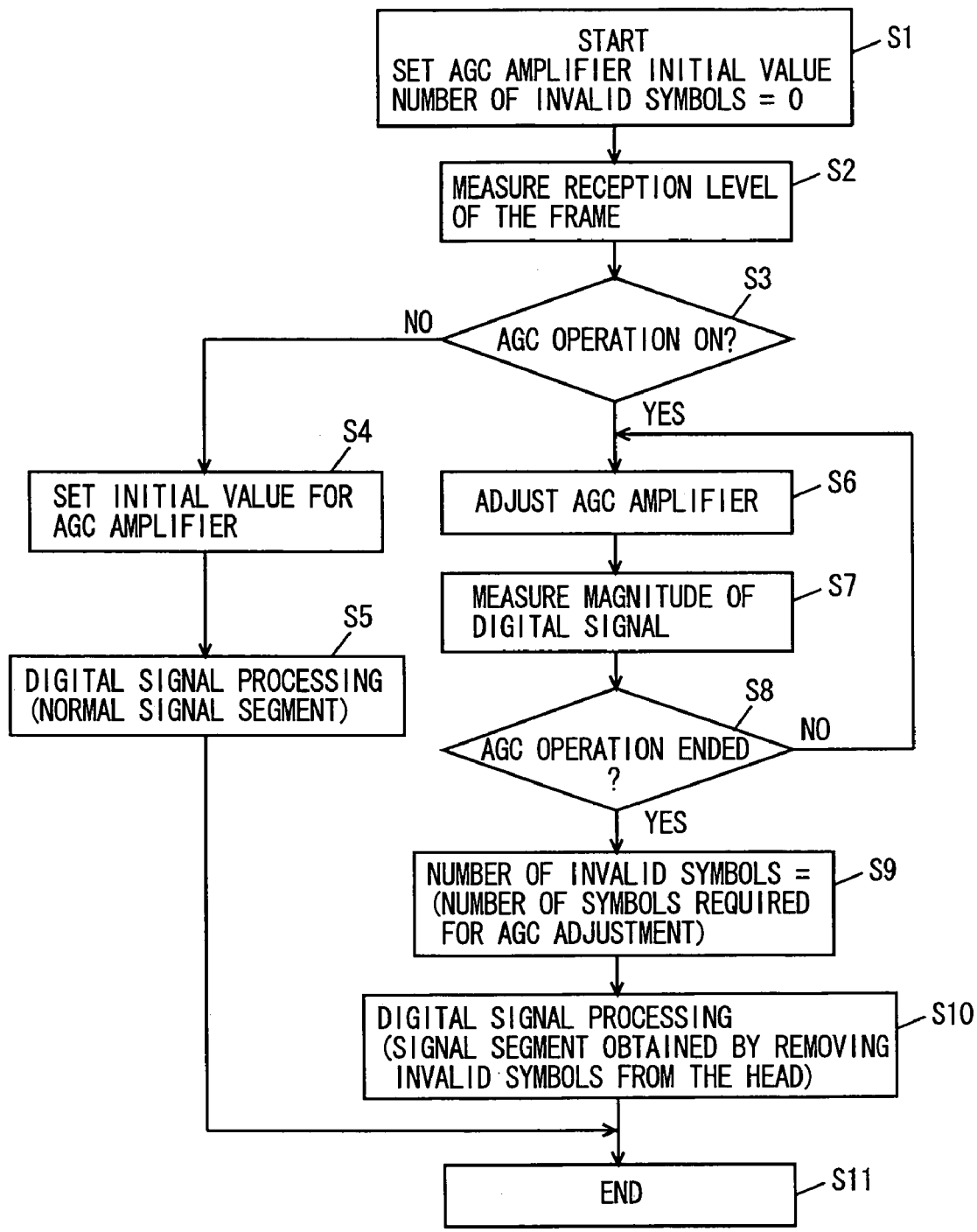

US 7,068,988 B2

1

RADIO RECEPTION APPARATUS, SIGNAL PROCESSING TIMING CONTROL METHOD, AND SIGNAL PROCESSING TIMING CONTROL PROGRAM

TECHNICAL FIELD

The present invention relates to a radio reception apparatus, a signal processing timing control method, and a signal processing timing control program, and more particularly to a radio reception apparatus, a signal processing timing control method, and a signal processing timing control program for use, for example, in a base station in a mobile communication system requiring a high communication quality as in data communication.

BACKGROUND ART

Conventionally, Automatic Gain Control (AGC) has widely been employed in order to converge a level of a received signal at a desired level in a radio reception apparatus. FIG. 5 is a schematic block diagram showing, as an exemplary conventional radio reception apparatus employing AGC, a configuration of a radio reception apparatus for use in a mobile communication system (a base station or mobile station thereof), for example, PHS (Personal Handyphone System).

Referring to FIG. 5, a burst signal in each frame of PHS received at an antenna 1 is amplified by a reception amplifier 2 with a variable gain. At the start of reception of a burst signal of each frame, the gain of reception amplifier 2 is preset at a certain initial value.

The received signal amplified by reception amplifier 2 is converted into a digital signal by an A/D converter 3 and is then subjected to quadrature modulation in a prescribed modulation method (for example, π/4QPSK (Quadrature Phase Shift Keying) method) by a quadrature modulator 4.

The output of quadrature modulator 4 is provided to a digital signal processing unit 5 for prescribed signal processing (for example, a synchronization process, propagation path estimation, weight estimation for adaptive arrays, and the like) and is also provided to an AGC control unit 6.

AGC control unit 6 monitors a digital output supplied from quadrature modulator 4, generates a control output for adjusting a variable gain of reception amplifier 2 such that a power level of the analog received signal in the frame converges at a prescribed level, and provides the control output to a gain control input of reception amplifier 2.

In this manner, in the conventional AGC operation, a burst signal in each frame of a received signal is received while its reception power level information is measured for use in adjusting the gain of the reception amplifier. For each frame, it usually takes approximately a few μ seconds from the starting point of time of each frame to converge an analog received signal level at a prescribed level through the above-described AGC operation.

Therefore, a few leading symbols of a digital signal for each frame obtained by performing A/D conversion on the output from reception amplifier 2 using A/D converter 3 during such a time period of about a few μ seconds may suffer erroneous amplitude values.

FIG. 6 is a diagram showing a waveform of a digital signal in a frame obtained through the above-described AGC operation. In FIG. 6, the axis of abscissas shows time (the number of symbols in the frame) and the axis of ordinates shows the magnitude (amplitude value) of the digital signal subjected to the AGC process.

2

As can be seen from the waveform diagram of FIG. 6, for example, if an initial value of a gain of reception amplifier 2 is set at a properly large value, a digital signal obtained in the beginning of the frame has a swell in its amplitude value and it takes a period of a few symbols to converge the amplitude value at a proper amplitude value through the AGC process. It is noted that it is actually impossible to set an appropriate initial value as an initial gain of reception amplifier 2 since the degree of fading varies greatly depending on a propagation path.

In a signal format of PHS, for example, a head portion of each frame includes a known signal segment including a preamble (PR), a unique word (UW), and the like. A known signal in this segment is used to perform a variety of signal processing as described above.

In the example shown in FIG. 6, a digital signal having an erroneous amplitude value occurs in a part of this known signal segment. Such a signal, however, is included as it is in the conventional digital signal processing segment. In other words, in the conventional mobile communication system such as PHS, since the well-known π/4QPSK method, for example, is generally employed as a modulation method, no reception error takes place during signal processing even if the amplitude value of the digital signal resulting from AGC is erroneous as described above.

More specifically, in the π/4QPSK method, a symbol point of a received signal corresponds to any of eight signal points positioned concentrically on an IQ coordinate plane, as is well known. Therefore, there is a one-to-one correspondence between a phase angle (direction) on the IQ coordinate plane and the symbol point. In other words, in this method, since a determination is made only based on a phase component of a digital signal, a symbol point is correctly recognized even if the amplitude value of the digital signal is inappropriate. Therefore, a reception error does not take place in signal processing at a subsequent stage.

Recent mobile communication systems, however, require data transmission of larger volume at higher speed, as compared with conventional voice communication. Accordingly, multi-value modulation methods having number of multi-values larger than the π/4QPSK method mentioned above have been developed. As an example of such multi-value modulation method, the well-known 16QAM (Quadrature Amplitude Modulation) method has been practically utilized in some type of data communication. According to the 16QAM modulation method, a symbol point of a received signal corresponds to any of a total of 16 signal points on the coordinate plane, arranged four by four in a lattice form in each quadrant of the IQ coordinate plane, as is well known. In other words, in this method, a determination of a symbol point is made based on both of a phase component and an amplitude component of a digital signal.

When the 16 QAM method is employed as a modulation method for PHS and if the amplitude value of the digital signal is inappropriate as shown in FIG. 6, a certain symbol point may possibly be recognized erroneously as another symbol point with the same phase with a different amplitude value, resulting in a reception error in signal processing at a subsequent stage.

The 16QAM method has already been put into practical use in some types of data communication. In a data format in such data communication, a sufficiently long signal segment is provided as a known signal segment such as a preamble. Even if the amplitude value takes an erroneous value resulting from AGC in a head portion of data, by ignoring the signal segment suffering this erroneous amplitude value, required signal processing can be performed sufficiently in the remaining known signal segment.

In the mobile communication system such as PHS, however, the known signal segment such as PR, UW is limited to a short segment of a few symbols at the head of each frame according to a signal format standard in order to secure transmission data volume. Therefore, when a multi-value modulation method such as the 16QAM method is employed, the amplitude value is erroneous in a large segment within the known signal segment, as shown in FIG. 6, resulting in a reception error during the digital signal processing.

An object of the present invention is therefore to provide a radio reception apparatus, a signal processing timing control method, and a signal processing timing control program, in which reception errors resulting from a AGC process are prevented even when a multi-value modulation method is employed to allow for high quality and large volume transmission, in a mobile communication system having a signal format that does not allow for a sufficient length of a known signal segment.

DISCLOSURE OF THE INVENTION

In accordance with one aspect of the present invention, a radio reception apparatus processing a received signal formed of a signal series having a known signal segment at a head portion includes amplification means, signal processing means, gain control means, and determination means. The amplification means amplifies the received signal with a variable gain. The signal processing means performs prescribed signal processing on the received signal amplified by the amplification means. The gain control means controls the variable gain of the amplification means such that a level of the received signal amplified by the amplification means converges at a prescribed level. The determination means determines and indicates to the signal processing means a signal segment length to be excluded from the prescribed signal processing from a head of the received signal so as to avoid an effect of control of the variable gain. The signal processing means performs the prescribed signal processing on a signal segment, excluding the indicated signal segment length, from the head of the received signal.

In accordance with another aspect of the present invention, a radio reception apparatus processing a received signal formed of a signal series having a known signal segment at a head portion includes amplification means, signal processing means, and control means. The amplification means amplifies the received signal with a variable gain. The signal processing means performs prescribed signal processing on the received signal amplified by the amplification means. The control means controls the variable gain of the amplification means such that a level of the received signal amplified by the amplification means converges at a prescribed level, and determines and indicates to the signal processing means a signal segment length from a head of the received signal that is required for the level of the received signal to converge at the prescribed level. The signal processing means performs the prescribed signal processing on a signal segment, excluding the indicated signal segment length, from the head of the received signal.

In accordance with a further aspect of the present invention, a radio reception apparatus processing a received signal formed of a signal series having a known signal segment at a head portion includes amplification means, signal processing means, and control means. The amplification means amplifies the received signal with a variable gain. The signal processing means performs prescribed signal processing on the received signal amplified by the amplification means. The control means controls the variable gain of the amplification means such that a level of the received signal amplified by the amplification means converges at a prescribed level, and determines and indicates to the signal processing means passage of a prescribed signal segment length from a head of the received signal that is set within the known signal segment. The signal processing mean is responsive to the indication of the passage for performing the prescribed signal processing on a signal segment excluding the prescribed signal segment length from the head of the received signal.

Preferably, the control means does not control the variable gain, when the level of the received signal amplified by the amplification means initially converges at the prescribed level, and the signal processing means performs the prescribed signal processing from the head of the received signal.

In accordance with yet another aspect of the present invention, a radio reception apparatus processing a received signal formed of a signal series having a known signal segment at a head portion includes amplification means, digital modulation means, and digital signal processing means. The amplification means amplifies the received signal with a variable gain. The digital modulation means modulates the received signal amplified by the amplification means into a digital received signal. The digital signal processing means receives the digital received signal, controls the variable gain of the amplification means such that a level of the received signal amplified by the amplification means converges at a prescribed level, determines a signal segment length to be excluded from prescribed signal processing from a head of the received signal so as to avoid an effect of control of the variable gain, and performs the prescribed signal processing on a signal segment, excluding the determined signal segment length, from the head of the received signal.

In accordance with still another aspect of the present invention, a radio reception apparatus processing a received signal formed of a signal series having a known signal segment at a head portion includes amplification means, digital modulation means, and digital signal processing means. The amplification means amplifies the received signal with a variable gain. The digital modulation means modulates the received signal amplified by the amplification means into a digital received signal. The digital signal processing means receives the digital received signal, controls the variable gain of the amplification means such that a level of the received signal amplified by the amplification means converges at a prescribed level, determines a signal segment length from a head of the received signal that is required for the level of the received signal to converge at the prescribed level, and performs prescribed signal processing on a signal segment, excluding the determined signal segment length, from the head of the received signal.

In accordance with a still further aspect of the present invention, a radio reception apparatus processing a received signal formed of a signal series having a known signal segment at a head portion includes amplification means, digital modulation means, and digital signal processing means. The amplification means amplifies the received signal with a variable gain. The digital modulation means modulates the received signal amplified by the amplification means into a digital received signal. The digital signal processing means receives the digital received signal, controls the variable gain of the amplification means such that a level of the received signal amplified by the amplification means converges at a prescribed level, determines passage of a prescribed signal segment length from a head of the received signal that is set within the known signal segment, and, in response to the determination, performs prescribed signal processing on a signal segment excluding the prescribed signal segment length from the head of the received signal.

Preferably, when the level of the received signal amplified by the amplification means initially converges at the prescribed level, the digital signal processing means does not control the variable gain and performs the prescribed signal processing from the head of the received signal.

In accordance with another aspect of the present invention, a signal processing timing control method in a radio reception apparatus processing a received signal formed of a signal series having a known signal segment at a head portion is provided. The radio reception apparatus includes amplification means amplifying the received signal with a variable gain. The signal processing timing control method includes the steps of: controlling the variable gain of the amplification means such that a level of the received signal amplified by the amplification means converges at a prescribed level; determining a signal segment length to be excluded from prescribed signal processing from a head of the received signal so as to avoid an effect of control of the variable gain; and performing the prescribed signal processing on a signal segment, excluding the determined signal segment length, from the head of the received signal.

In accordance with a further aspect of the present invention, a signal processing timing control method in a radio reception apparatus processing a received signal formed of a signal series having a known signal segment at a head portion is provided. The radio reception apparatus includes amplification means amplifying the received signal with a variable gain. The signal processing timing control method includes the steps of: controlling the variable gain of the amplification means such that a level of the received signal amplified by the amplification means converges at a prescribed level; determining a signal segment length from a head of the received signal that is required for the level of the received signal to converge at the prescribed level; and performing prescribed signal processing on a signal segment, excluding the determined signal segment length, from the head of the received signal.

In accordance with still another aspect of the present invention, a signal processing timing control method in a radio reception apparatus processing a received signal formed of a signal series having a known signal segment at a head portion is provided. The radio reception apparatus includes amplification means amplifying the received signal with a variable gain. The signal processing timing control method includes the steps of: controlling the variable gain of the amplification means such that a level of the received signal amplified by the amplification means converges at a prescribed level; determining passage of a prescribed signal segment length from a head of the received signal that is set within the known signal segment; and, in response to the determination, performing prescribed signal processing on a signal segment excluding the prescribed signal segment length from the head of the received signal.

Preferably, the signal processing timing control method further includes the steps of: determining whether the level of the received signal amplified by the amplification means initially converges at the prescribed level; and performing the prescribed signal processing from the head of the received signal without controlling the variable gain, when it is determined that the level of the received signal amplified by the amplification means initially converges at the prescribed level.

In accordance with a still further aspect of the present invention, a signal processing timing control program in a radio reception apparatus processing a received signal formed of a signal series having a known signal segment at a head portion is provided. The radio reception apparatus includes amplification means amplifying the received signal with a variable gain. The signal processing timing control program causes a computer to execute the steps of: controlling the variable gain of the amplification means such that a level of the received signal amplified by the amplification means converges at a prescribed level; determining a signal segment length to be excluded from prescribed signal processing from a head of the received signal so as to avoid an effect of control of the variable gain; and performing the prescribed signal processing on a signal segment, excluding the determined signal segment length, from the head of the received signal.

In accordance with yet another aspect of the present invention, a signal processing timing control program in a radio reception apparatus processing a received signal formed of a signal series having a known signal segment at a head portion is provided. The radio reception apparatus includes amplification means amplifying the received signal with a variable gain. The signal processing timing control program causes a computer to execute the steps of: controlling the variable gain of the amplification means such that a level of the received signal amplified by the amplification means converges at a prescribed level; determining a signal segment length from a head of the received signal that is required for the level of the received signal to converge at the prescribed level; and performing prescribed signal processing on a signal segment, excluding the determined signal segment length, from the head of the received signal.

In accordance with yet still another aspect of the present invention, a signal processing timing control program in a radio reception apparatus processing a received signal formed of a signal series having a known signal segment at a head portion is provided. The radio reception apparatus includes amplification means amplifying the received signal with a variable gain. The signal processing timing control program causes a computer to execute the steps of: controlling the variable gain of the amplification means such that a level of the received signal amplified by the amplification means converges at a prescribed level; determining passage of a prescribed signal segment length from a head of the received signal that is set within the known signal segment; and, in response to the determination, performing prescribed signal processing on a signal segment excluding the prescribed signal segment length from the head of the received signal.

Preferably, the signal processing timing control program further causes a computer to execute the steps of determining whether the level of the received signal amplified by the amplification means initially converges at the prescribed level; and performing the prescribed signal processing from the head of the received signal without controlling the variable gain, when it is determined that the level of the received signal amplified by the amplification means initially converges at the prescribed level.

Therefore, in accordance with the present invention, even when a multi-value modulation method is employed in a mobile communication system having a signal format that does not allow for a sufficient length of a known signal segment, signal processing is performed in a known signal segment excluding a segment affected by an AGC process. Accordingly, reception errors resulting from the AGC process can be prevented.

Furthermore, in accordance with the present invention, even when a multi-value modulation method is employed in a mobile communication system having a signal format that does not allow for a sufficient length of a known signal segment, a time point when an AGC process ends is determined, so that signal processing is performed in a known signal segment excluding the AGC process period of time. Accordingly, reception errors resulting from the AGC process can be prevented.

In addition, in accordance with the present invention, even when a multi-value modulation method is employed in a mobile communication system having a signal format that does not allow for a sufficient length of a known signal segment, a minimum segment required for signal processing in the latter half of a known signal segment is determined by counting, so that the signal processing is performed in that segment. Accordingly, reception errors resulting from the AGC process can be prevented.

BRIEF DESCRIPTION OF THE DRAWINGS

FIG. 3 is a flowchart illustrating an exemplary operation of the radio reception apparatus shown in FIG. 1.

BEST MODES FOR CARRYING OUT THE INVENTION

Figure 1:
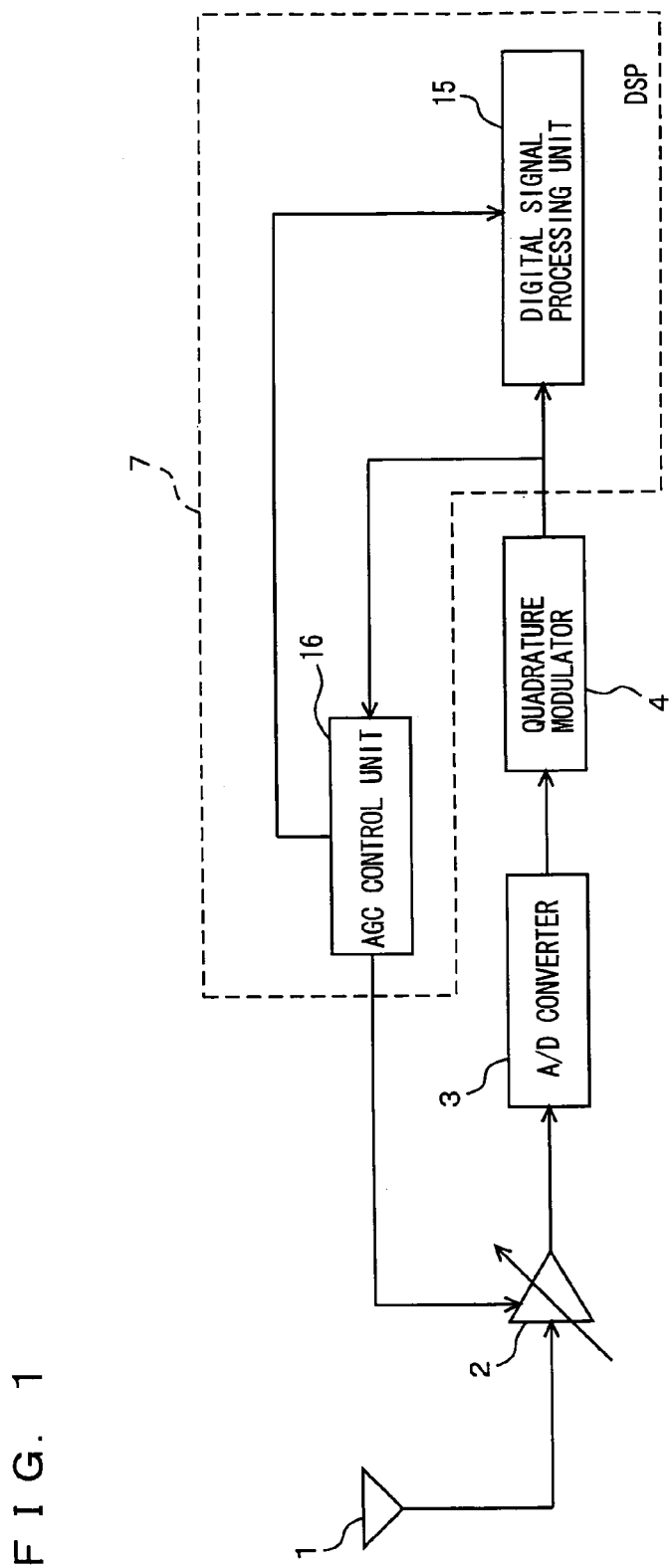
FIG. 1 is a functional block diagram showing a configuration of a radio reception apparatus in an embodiment of the present invention.

In the following, an embodiment of the present invention will be described in detail with reference to the figures. It is noted that in the figures the same or corresponding parts will be denoted with the same reference characters and the description thereof will not be repeated.

FIG. 1 is a functional block diagram showing a configuration of a radio reception apparatus applied in a base station of a mobile communication system, for example, PHS, in accordance with the embodiment of the present invention. It is assumed that the embodiment described below employs the well-known 16QAM as a multi-value modulation method.

Figure 5:
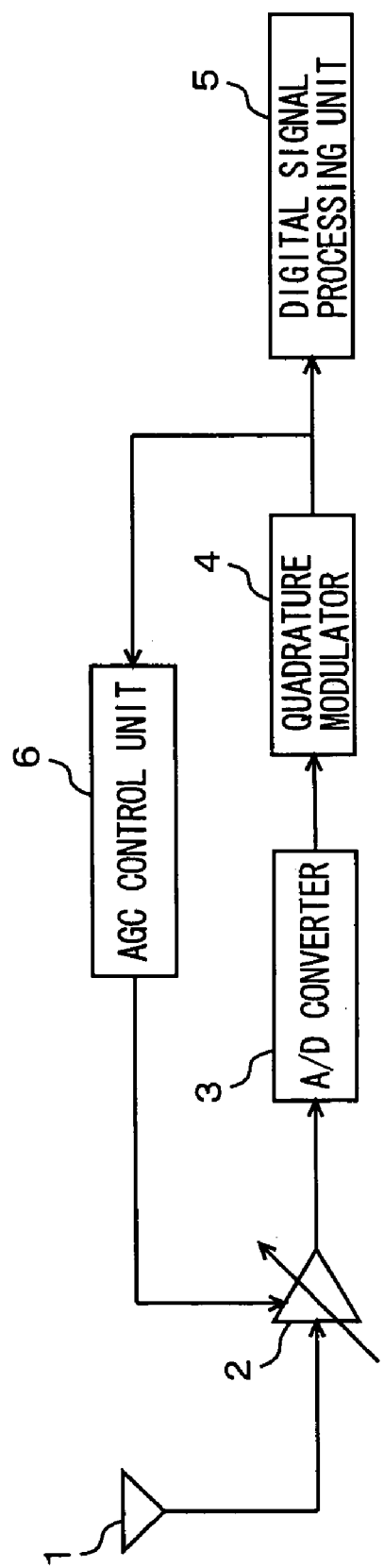
FIG. 5 is a block diagram showing a configuration of a conventional radio reception apparatus.

The radio reception apparatus shown in FIG. 1 is the same as the conventional radio reception apparatus shown in FIG. 5 except the following: in addition to the operation of producing an AGC control signal in the AGC control unit shown in FIG. 5, an AGC control unit 16 generates a signal indicative of passage of a segment that should be excluded from signal processing in a head portion of a known signal segment for each frame and provides the signal to a digital signal processing unit 15.

Digital signal processing unit 15 performs signal processing similar to that in digital signal processing unit 5 in FIG. 5 (a synchronization process, a propagation path estimation process, an adaptive array weight estimation process, and the like) on a known signal segment, excluding the segment indicated by the signal from AGC control unit 16, of the known signal segment of each frame.

Figure 2:
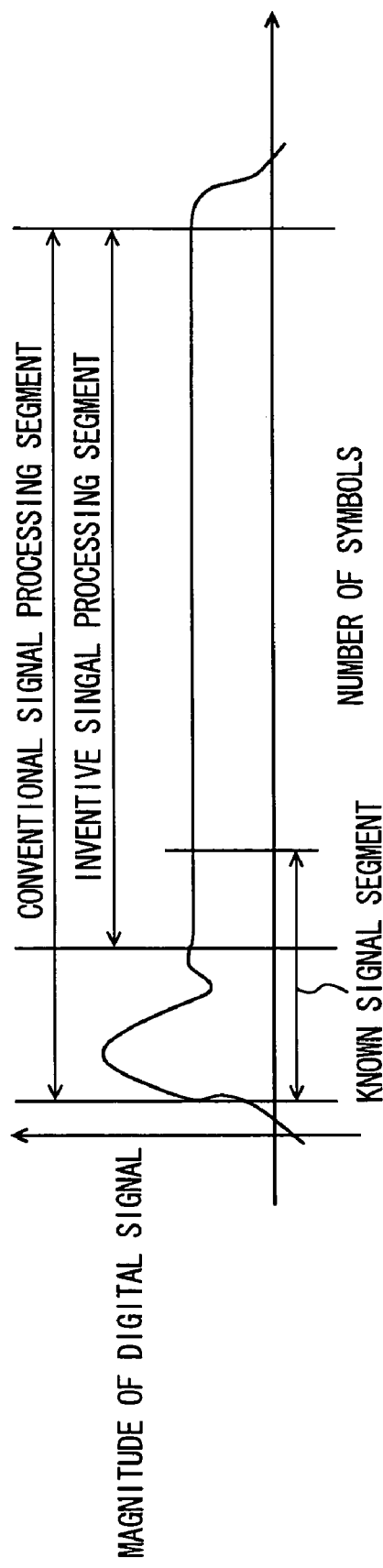
FIG. 2 is a timing diagram illustrating an operational timing of the radio reception apparatus shown in FIG. 1.
Figure 6:
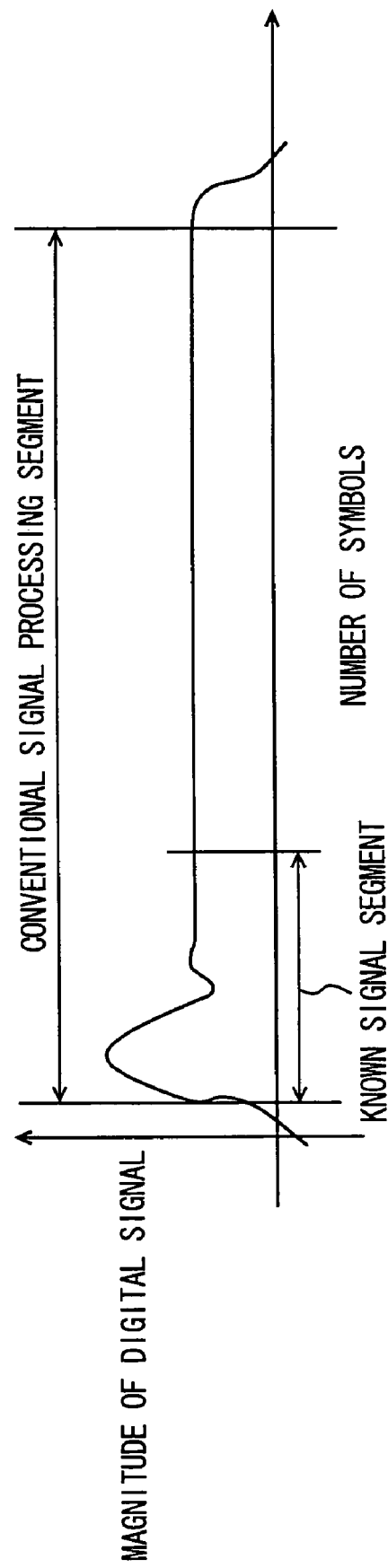
FIG. 6 is a timing diagram illustrating an operational timing of the radio reception apparatus shown in FIG. 5.

FIG. 2 is a waveform diagram illustrating an operation of the radio reception apparatus shown in FIG. 1. In the waveform diagram of the conventional example shown in FIG. 6, signal processing is performed from the head of the known signal segment of each frame, irrespective of the swell in the amplitude value of the digital signal due to the AGC process, whereas, in the embodiment of the present invention shown in FIG. 2, signal processing is performed after the swell of the digital signal due to the AGC process converges and then the effect of the AGC process disappears.

In this way, when the AGC operation ends within the known signal segment such as PR, UW in PHS, by ignoring the AGC period of a few symbols having erroneous amplitude values, prescribed signal processing (a synchronization process, propagation path estimation, adaptive array weight estimation, and the like) is performed in the remaining known signal segment. Accordingly, reception errors in the digital signal processing unit can be prevented thereby improving the communication quality.

In this way, the method of determining a known signal segment for avoiding effects of the AGC process may include the followings, for example.

According to a first method, an AGC control unit 16 of FIG. 1 determines whether a reception level converges at a prescribed level, that is, whether the AGC process ends and a digital signal having a proper amplitude value begins to be obtained, and notifies digital signal processing unit 15 of the determined time point. Immediately when it is determined that a digital signal having a proper amplitude value begins to be obtained, prescribed signal processing on a digital signal is started in digital signal processing unit 15.

Therefore, in a limited length of a known signal segment, a time point when a signal suitable for signal processing is obtained can be determined as quickly as possible, so that prescribed signal processing can be performed with maximum efficiency without reception errors in the remaining known signal segment.

According to a second method, a prescribed number of unnecessary symbols (a signal segment length) is counted from the head of the known signal segment, such that a prescribed minimum number of symbols (a signal segment length) required for signal processing in digital signal processing unit 15 are spared in the latter half of the known signal segment. Digital signal processing unit 15 is notified of the time point when the number of unnecessary symbols have passed. Irrespective of the result of the AGC process, digital signal processing unit 15 starts prescribed signal processing on a digital signal at the time when a prescribed number of symbols have passed.

Accordingly, the minimum known signal segment required for the prescribed processing can be utilized entirely, even in the segment in which the effect of the AGC process remains more or less.

The function of AGC control unit 16 and digital signal processing unit 15 shown in FIG. 1 can be implemented by software, for example, using a Digital Signal Processor (DSP) or the like. A method according to the embodiment of the present invention is executed by software according to each flowchart using this DSP. This DSP reads a program including each step of each flowchart from a not-shown memory for execution. This program can be installed from the outside source.

FIG. 3 is a flowchart showing a control where the first method described above is implemented by software.

First, at step S1, an initial value of a gain for an AGC process of reception amplifier 2 in the frame is set, and a count value of the number of symbols to be invalidated is set at zero.

Then, at step S2, measurement of a reception signal level in the frame (the magnitude of the digital signal subjected to A/D conversion) is started.

At step S3, if the setting of the initial value is appropriate, and therefore the reception level at the start of reception does not largely deviate from a prescribed level and substantially converges, it can be assumed that the reception errors as described above will not take place. Therefore, the AGC operation is not started, and the above-noted initial value is set as it is for reception amplifier 2 (step S4). Then, prescribed digital signal processing is performed from a normal signal processing segment, that is, the head of the known signal segment (step S5). Thereafter, all the processes are ended at step S11.

On the other hand, if it is determined at step S3 that the initial reception level largely deviates from the prescribed level, an AGC operation is started.

First, at step S6, the gain of reception amplifier 2 is adjusted. At step S7, the level of the received signal (the magnitude of the digital signal) is measured again. As a result, until it is determined at step S8 that the reception level converges at the prescribed level, the processes at steps S6–8 are repeated. If it is determined that the reception level converges, the AGC operation is ended at step S8, and at step S9, the number of symbols to be invalidated that are required for the AGC process is calculated.

Then, at step S10, prescribed digital signal processing is performed on the remaining known signal segment obtained by eliminating the invalid symbols from the head of the known-signal segment. All the processes are ended at step S11.

In the example shown in FIG. 3, in the limited length of the known signal segment, the time point when a signal suitable for signal processing is obtained, that is, the AGC ending point of time, is determined as quickly as possible, so that the prescribed signal processing can be performed without reception errors with the maximum efficiency in the remaining known signal segment.

Figure 4:
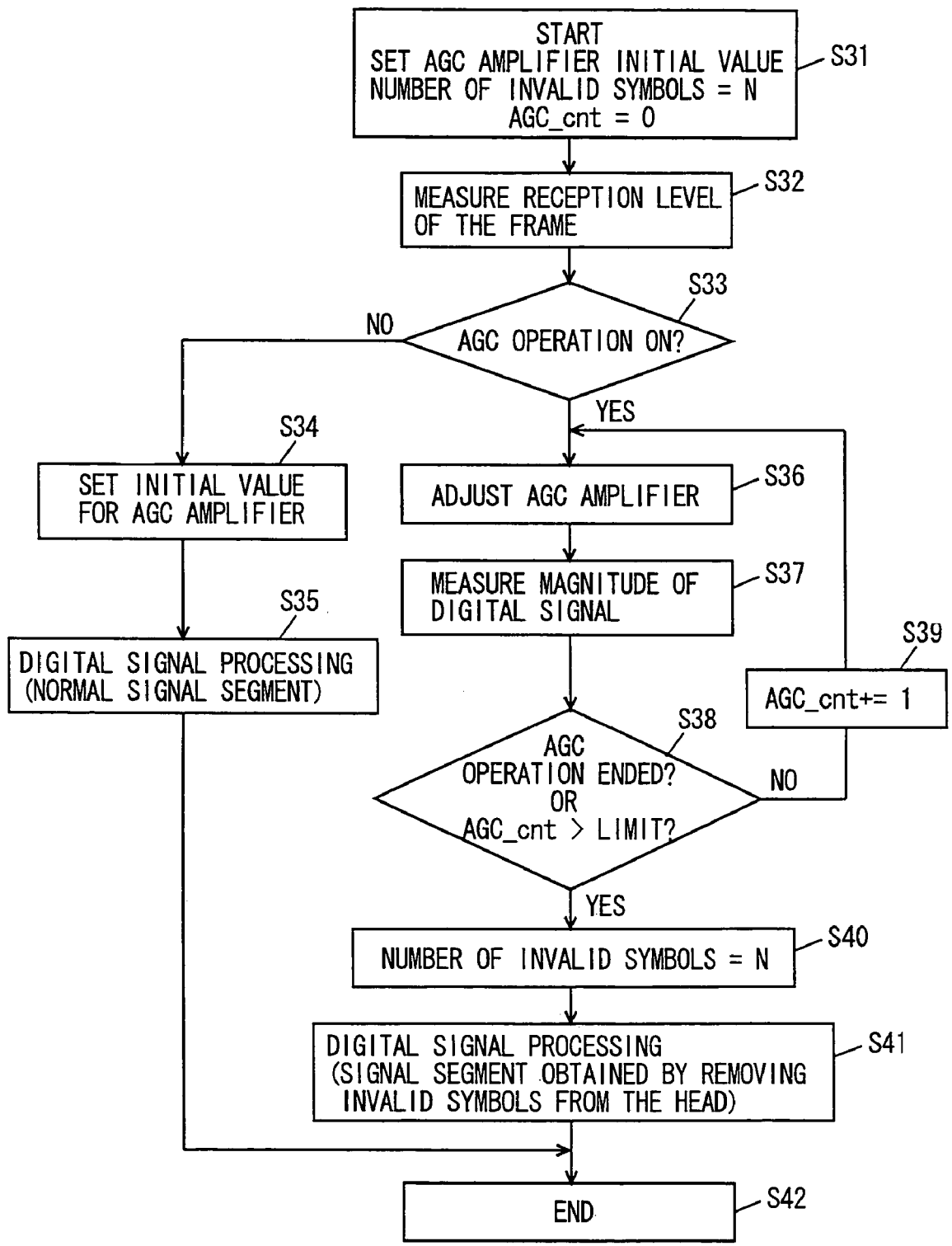
FIG. 4 is a flowchart illustrating another exemplary operation of the radio reception apparatus shown in FIG. 1.

FIG. 4 is a flowchart showing a control where the second method described above is implemented by software.

First, at step S31, an initial value of a gain for an AGC process of reception amplifier 2 in the frame is set, and the number of symbols to be invalidated is set at a predetermined value N. Furthermore, a counter AGC_cnt, which counts an AGC process time corresponding to the prescribed number N of invalid symbols, is set at zero.

Then, at step S32, measurement of the reception signal level (the magnitude of the digital signal subjected to A/D conversion) in the frame is started.

At step S33, if the setting of the initial value is appropriate, and therefore the reception level at the start of reception does not largely deviate from a prescribed level and substantially converges, it can be assumed that the reception errors described above will not take place. Accordingly, the AGC operation is not started, and the initial value above is set as it is for reception amplifier 2 (step S34). The prescribed signal processing is performed from a normal signal processing segment, that is, the head of the known signal segment (step S35). Then, all the processes are ended at step S42.

On the other hand, if it is determined at step S33 that the initial reception level largely deviates from the prescribed level, the AGC operation is started.

First, at step S36, the gain of reception amplifier 2 is adjusted. At step S37, the level of the received signal (the magnitude of the digital signal) is measured again. As a result, at step S38, until it is determined that the reception level converges at the prescribed level or until it is determined that the count of counter AGC_cnt reaches a limit value corresponding to the number N of invalid symbols, the processes at steps S36–38 are repeated while AGC_cnt is incremented one by one, at step S39.

If it is determined at step S38 that the reception level converges (the AGC operation ends) or that AGC_cnt reaches the limit value, the prescribed number N of invalid symbols is read at step S40.

Then, at step S41, irrespective of whether the AGC operation ends, the prescribed digital signal processing is performed on the remaining known signal segment obtained by eliminating the above-mentioned prescribed number N of invalid symbols from the head of the known signal segment. At step S42, all the processes are ended.

In the example shown in FIG. 4, the minimum known signal segment (the segment excluding N) required for the prescribed processing can be utilized entirely, even in the segment in which the effect of the AGC process remains more or less.

Usually, it is effective to estimate the gain initial value of reception amplifier 2 in each frame from the magnitude of the reception level before the previous frame. However, when the reception level varies greatly due to the fading environment and the like, the aforementioned reception errors are likely to take place. Then, the method shown in FIG. 3 or 4 as described above is particularly effective.

Although the foregoing embodiment has been described as employing the 16QAM method as a multi-value modulation method, the multi-value modulation method applicable to the present invention is not limited to the 16QAM method and any modulation method is applicable as long as the amplitude information of the received signal is determined.

Although the foregoing embodiment has been described with respect to PHS as an exemplary mobile communication system, the present invention is not limited to PHS and may be applied to a mobile communication system having such a format in that the length of the known signal segment is limited.

As described above, in accordance with the present invention, reception errors in the digital signal processing unit resulting from the AGC process for the analog received signal can be prevented even if a multi-value modulation method such as 16QAM is employed to allow for high quality and large volume transmission, in a mobile communication system such as PHS having a signal format in which the standard does not allow a sufficient length of the known signal segment.

INDUSTRIAL APPLICABILITY

As described above, the radio reception apparatus, the signal processing timing control method, and the signal processing timing control program in accordance with the present invention are useful in a mobile communication system employing a multi-value modulation method, since reception errors resulting from an AGC process can be prevented even in a signal format that does not allow for a sufficient length of a known signal segment.

The invention claimed is:

1. A radio reception apparatus processing a received signal formed of a signal series having a known signal segment at a head portion, comprising:
   amplification means amplifying said received signal with a variable gain;
   signal processing means performing prescribed signal processing on said received signal amplified by said amplification means;
   gain control means controlling said variable gain of said amplification means such that a level of said received signal amplified by said amplification means converges at a prescribed level; and
   determination means determining and indicating to said signal processing means a signal segment length to be excluded from said prescribed signal processing from a head of said received signal so as to avoid an effect of control of said variable gain, wherein
   said signal processing means performs said prescribed signal processing on a signal segment, excluding said indicated signal segment length, from the head of said received signal.

2. The radio reception apparatus according to claim 1, wherein said control means does not control said variable gain, when the level of said received signal amplified by said amplification means initially converges at said prescribed level, and said signal processing means performs said prescribed signal processing from the head of said received signal.

3. A radio reception apparatus processing a received signal formed of a signal series having a known signal segment at a head portion, comprising:
   amplification means amplifying said received signal with a variable gain;
   signal processing means performing prescribed signal processing on said received signal amplified by said amplification means; and
   control means controlling said variable gain of said amplification means such that a level of said received signal amplified by said amplification means converges at a prescribed level, and determining and indicating to said signal processing means a signal segment length from a head of said received signal that is required for the level of said received signal to converge at said prescribed level, wherein
   said signal processing means performs said prescribed signal processing on a signal segment, excluding said indicated signal segment length, from the head of said received signal.

4. The radio reception apparatus according to claim 3, wherein said control means does not control said variable gain, when the level of said received signal amplified by said amplification means initially converges at said prescribed level, and said signal processing means performs said prescribed signal processing from the head of said received signal.

5. A radio reception apparatus processing a received signal formed of a signal series having a known signal segment at a head portion, comprising:
   amplification means amplifying said received signal with a variable gain;
   signal processing means performing prescribed signal processing on said received signal amplified by said amplification means;
   control means controlling said variable gain of said amplification means such that a level of said received signal amplified by said amplification means converges at a prescribed level, and determining and indicating to said signal processing means passage of a prescribed signal segment length from a head of said received signal that is set within said known signal segment, wherein
   said signal processing mean is responsive to the indication of said passage for performing said prescribed signal processing on a signal segment excluding said prescribed signal segment length from the head of said received signal.

6. The radio reception apparatus according to claim 5, wherein said control means does not control said variable gain, when the level of said received signal amplified by said amplification means initially converges at said prescribed level, and said signal processing means performs said prescribed signal processing from the head of said received signal.

7. A radio reception apparatus processing a received signal formed of a signal series having a known signal segment at a head portion, comprising:
   amplification means amplifying said received signal with a variable gain;
   digital modulation means modulating said received signal amplified by said amplification means into a digital received signal; and
   digital signal processing means receiving said digital received signal, wherein
   said digital signal processing means
   controls said variable gain of said amplification means such that a level of said received signal amplified by said amplification means converges at a prescribed level,
   determines a signal segment length to be excluded from prescribed signal processing from a head of said received signal so as to avoid an effect of control of said variable gain, and
   performs said prescribed signal processing on a signal segment, excluding said determined signal segment length, from the head of said received signal.

8. The radio reception apparatus according to claim 7, wherein when the level of said received signal amplified by said amplification means initially converges at said prescribed level, said digital signal processing means does not control said variable gain and performs said prescribed signal processing from the head of said received signal.

9. A radio reception apparatus processing a received signal formed of a signal series having a known signal segment at a head portion, comprising:
   amplification means amplifying said received signal with a variable gain;
   digital modulation means modulating said received signal amplified by said amplification means into a digital received signal; and
   digital signal processing means receiving said digital received signal, wherein
   said digital signal processing means
   controls said variable gain of said amplification means such that a level of said received signal amplified by said amplification means converges at a prescribed level,
   determines a signal segment length from a head of said received signal that is required for the level of said received signal to converge at said prescribed level, and
   performs prescribed signal processing on a signal segment, excluding said determined signal segment length, from the head of said received signal.

10. The radio reception apparatus according to claim 9, wherein when the level of said received signal amplified by said amplification means initially converges at said prescribed level, said digital signal processing means does not control said variable gain and performs said prescribed signal processing from the head of said received signal.

11. A radio reception apparatus processing a received signal formed of a signal series having a known signal segment at a head portion, comprising:
   amplification means amplifying said received signal with a variable gain;
   digital modulation means modulating said received signal amplified by said amplification means into a digital received signal; and
   digital signal processing means receiving said digital received signal, wherein
   said digital signal processing means
   controls said variable gain of said amplification means such that a level of said received signal amplified by said amplification means converges at a prescribed level,
   determines passage of a prescribed signal segment length from a head of said received signal that is set within said known signal segment, and
   in response to said determination, performs prescribed signal processing on a signal segment excluding said prescribed signal segment length from the head of said received signal.

12. The radio reception apparatus according to claim 11, wherein when the level of said received signal amplified by said amplification means initially converges at said prescribed level, said digital signal processing means does not control said variable gain and performs said prescribed signal processing from the head of said received signal.

13. A signal processing timing control method in a radio reception apparatus processing a received signal formed of a signal series having a known signal segment at a head portion, said radio reception apparatus including amplification means amplifying said received signal with a variable gain,
   said signal processing timing control method comprising the steps of:
   controlling said variable gain of said amplification means such that a level of said received signal amplified by said amplification means converges at a prescribed level;
   determining a signal segment length to be excluded from prescribed signal processing from a head of said received signal so as to avoid an effect of control of said variable gain; and
   performing said prescribed signal processing on a signal segment, excluding said determined signal segment length, from the head of said received signal.

14. The signal processing timing control method according to claim 13, further comprising the steps of:
   determining whether the level of said received signal amplified by said amplification means initially converges at said prescribed level; and
   performing said prescribed signal processing from the head of said received signal without controlling said variable gain, when it is determined that the level of said received signal amplified by said amplification means initially converges at said prescribed level.

15. A signal processing timing control method in a radio reception apparatus processing a received signal formed of a signal series having a known signal segment at a head portion, said radio reception apparatus including amplification means amplifying said received signal with a variable gain,
   said signal processing timing control method comprising the steps of:
   controlling said variable gain of said amplification means such that a level of said received signal amplified by said amplification means converges at a prescribed level;
   determining a signal segment length from a head of said received signal that is required for the level of said received signal to converge at said prescribed level; and
   performing prescribed signal processing on a signal segment, excluding said determined signal segment length, from the head of said received signal.

16. The signal processing timing control method according to claim 15, further comprising the steps of:
   determining whether the level of said received signal amplified by said amplification means initially converges at said prescribed level; and
   performing said prescribed signal processing from the head of said received signal without controlling said variable gain, when it is determined that the level of said received signal amplified by said amplification means initially converges at said prescribed level.

17. A signal processing timing control method in a radio reception apparatus processing a received signal formed of a signal series having a known signal segment at a head portion, said radio reception apparatus including amplification means amplifying said received signal with a variable gain,
   said signal processing timing control method comprising the steps of:
   controlling said variable gain of said amplification means such that a level of said received signal amplified by said amplification means converges at a prescribed level;
   determining passage of a prescribed signal segment length from a head of said received signal that is set within said known signal segment; and
   in response to said determination, performing prescribed signal processing on a signal segment excluding said prescribed signal segment length from the head of said received signal.

18. The signal processing timing control method according to claim 17, further comprising the steps of:
   determining whether the level of said received signal amplified by said amplification means initially converges at said prescribed level; and
   performing said prescribed signal processing from the head of said received signal without controlling said variable gain, when it is determined that the level of said received signal amplified by said amplification means initially converges at said prescribed level.

19. A signal processing timing control program in a radio reception apparatus processing a received signal formed of a signal series having a known signal segment at a head portion, said radio reception apparatus including amplification means amplifying said received signal with a variable gain,
   said signal processing timing control program causing a computer to execute the steps of:
   controlling said variable gain of said amplification means such that a level of said received signal amplified by said amplification means converges at a prescribed level;
   determining a signal segment length to be excluded from prescribed signal processing from a head of said received signal so as to avoid an effect of control of said variable gain; and performing said prescribed signal processing on a signal segment, excluding said determined signal segment length, from the head of said received signal.

20. The signal processing timing control program according to claim 19, further causing a computer to execute the steps of:

determining whether the level of said received signal amplified by said amplification means initially converges at said prescribed level; and performing said prescribed signal processing from the head of said received signal without controlling said variable gain, when it is determined that the level of said received signal amplified by said amplification means initially converges at said prescribed level.

21. A signal processing timing control program in a radio reception apparatus processing a received signal formed of a signal series having a known signal segment at a head portion, said radio reception apparatus including amplification means amplifying said received signal with a variable gain, said signal processing timing control program causing a computer to execute the steps of:

controlling said variable gain of said amplification means such that a level of said received signal amplified by said amplification means converges at a prescribed level;

determining a signal segment length from a head of said received signal that is required for the level of said received signal to converge at said prescribed level; and performing prescribed signal processing on a signal segment, excluding said determined signal segment length, from the head of said received signal.

22. The signal processing timing control program according to claim 21, further causing a computer to execute the steps of:

determining whether the level of said received signal amplified by said amplification means initially converges at said prescribed level; and performing said prescribed signal processing from the head of said received signal without controlling said variable gain, when it is determined that the level of said received signal amplified by said amplification means initially converges at said prescribed level.

23. A signal processing timing control program in a radio reception apparatus processing a received signal formed of a signal series having a known signal segment at a head portion, said radio reception apparatus including amplification means amplifying said received signal with a variable gain, said signal processing timing control program causing a computer to execute the steps of:

controlling said variable gain of said amplification means such that a level of said received signal amplified by said amplification means converges at a prescribed level;

determining passage of a prescribed signal segment length from a head of said received signal that is set within said known signal segment; and in response to said determination, performing prescribed signal processing on a signal segment excluding said prescribed signal segment length from the head of said received signal.

24. The signal processing timing control program according to claim 23, further causing a computer to execute the steps of:

determining whether the level of said received signal amplified by said amplification means initially converges at said prescribed level; and performing said prescribed signal processing from the head of said received signal without controlling said variable gain, when it is determined that the level of said received signal amplified by said amplification means initially converges at said prescribed level.

\* \* \* \* \*